United States Patent
Leonardi et al.

[11] Patent Number: 6,114,746
[45] Date of Patent: *Sep. 5, 2000

[54] VERTICAL PNP TRANSISTOR AND RELATIVE FABRICATION METHOD

[75] Inventors: Salvatore Leonardi, Stazzo-Acireale; Pietro Lizzio; Davide Giuseppe Patti, both of Catania; Sergio Palara, Acitrezza, all of Italy

[73] Assignees: Consorzio per la Ricerca sulla Microelettronica nel Mezzogiorno, Catania; SGS-Thomson Microelectronics S.r.l., Agrate Brianza, both of Italy

[ * ] Notice: This patent issued on a continued prosecution application filed under 37 CFR 1.53(d), and is subject to the twenty year patent term provisions of 35 U.S.C. 154(a)(2).

[21] Appl. No.: 08/686,753

[22] Filed: Jul. 26, 1996

[30] Foreign Application Priority Data

Jul. 27, 1995 [EP] European Pat. Off. ............. 95830328

[51] Int. Cl.⁷ .................................................. H01L 27/082
[52] U.S. Cl. .......................... 257/592; 257/579; 257/583; 257/584; 257/593
[58] Field of Search .................................... 257/573, 579, 257/583, 584, 590, 592, 593

[56] References Cited

U.S. PATENT DOCUMENTS

| | | | |
|---|---|---|---|
| 3,935,587 | 1/1976 | Ostop et al. | 257/47 |
| 4,178,190 | 12/1979 | Polinsky | 148/1.5 |
| 5,060,044 | 10/1991 | Tomassetti | 257/370 |
| 5,179,432 | 1/1993 | Husher | 257/593 |
| 5,218,228 | 6/1993 | Williams et al. | 257/593 |
| 5,274,267 | 12/1993 | Moksvold | 257/592 |
| 5,326,710 | 7/1994 | Joyce et al. | 438/203 |
| 5,581,115 | 12/1996 | Grubisich et al. | 257/592 |
| 5,602,417 | 2/1997 | Villa | 257/593 |

FOREIGN PATENT DOCUMENTS

| | | | |
|---|---|---|---|
| 0 339 732 | 11/1989 | European Pat. Off. | H01L 21/82 |
| 1539042 | 6/1967 | France | H01L 19/00 |
| 55-033007 | 3/1980 | Japan | H01L 27/08 |
| 57-010963 | 1/1982 | Japan | H01L 27/08 |
| 363015463 | 1/1988 | Japan | 257/593 |
| 401268169 | 10/1989 | Japan | 257/593 |
| 2 156 583 | 10/1985 | United Kingdom | H01L 29/72 |

OTHER PUBLICATIONS

European Search Report from European Patent Application No. 95830328.1, filed Jul. 27, 1995.

*Primary Examiner*—David Hardy
*Assistant Examiner*—George C. Eckert, II
*Attorney, Agent, or Firm*—Wolf, Greenfield & Sacks, P.C.; James H. Morris; Theodore E. Galanthay

[57] ABSTRACT

A vertical PNP transistor integrated in a semiconductor material wafer having an N type substrate and an N type epitaxial layer forming a surface. The transistor has a P type buried collector region astride the substrate and the epitaxial layer; a collector sinker insulating an epitaxial tub from the rest of the wafer; a gain-modulating N type buried base region astride the buried collector region and the epitaxial tub, and forming a base region with the epitaxial tub; and a P type emitter region in the epitaxial tub. An N⁺ type base sinker extends from the surface, through the epitaxial tub to the buried base region. The gain of the transistor may be modulated by varying the extension and dope concentration of the buried base region, forming a constant or variable dope concentration profile of the buried base region, providing or not a base sinker, and varying the form and distance of the base sinker from the emitter region.

14 Claims, 7 Drawing Sheets

VERTICAL PNP TRANSISTOR AND RELATIVE FABRICATION METHOD

BACKGROUND OF THE INVENTION

1. Field of the Invention

The present invention relates to a vertical PNP transistor and relative fabrication method.

2. Discussion of the Related Art

As is known, in integrated circuits, vertical PNP transistors (i.e. in which current flows vertically, crosswise to the surface of the wafer of semiconductor material in which the transistors are integrated) are frequently formed simultaneously with NPN transistors. As traditional methods, however, of fabricating integrated circuits comprising both types of transistors involve a good deal of time and expense, various solutions have been devised for reducing the fabrication steps required, described for example in European Patent N. 0 339 732 filed by SGS-THOMSON MICRO-ELECTRONICS (corresponding to U.S. Pat. No. 4,898,836) and shown in FIG. 1.

Figure 1:
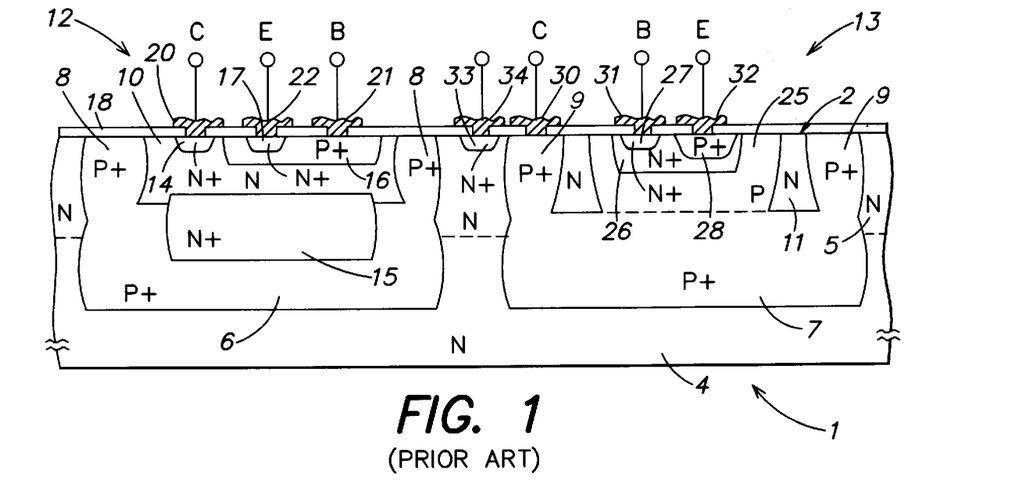
FIG. 1 shows a cross section of a semiconductor material wafer in which are formed an NPN transistor and a known PNP transistor.

As illustrated in FIG. 1, which shows a cross section of a semiconductor material wafer 1 with a top surface 2, the known solution referred to is based on the use of an N type substrate 4 on which an N type epitaxial layer 5 is grown; and separate $P^+$ type buried regions 6, 7 are formed astride substrate 4 and epitaxial layer 5, and are connected to surface 2 by respective $P^+$ type sinkers 8, 9 extending from the outer lateral edges of respective $P^+$ type buried regions 6, 7 and externally defining respective epitaxial tubs 10, 11 for respectively housing an NPN transistor 12 and PNP transistor 13.

More specifically, $P^+$ type buried region 6 constitutes an isolation region for electrically separating the NPN transistor from substrate 4 and epitaxial layer 5; an $N^+$ type buried collector region 15 is formed inside buried isolation region 6 and projects slightly inside epitaxial tub 10; a low-resistivity $N^+$ type region 14 and a detached $P^+$ type base region 16 are formed inside tub 10 facing surface 2 of wafer 1; an $N^+$ type emitter region 17 is formed inside base region 16 and facing surface 2; and NPN transistor 12 is completed by collector, base and emitter metal contact regions 20, 21, 22 formed through a protective oxide layer 18 and in direct electric contact with respective regions 14, 16, 17.

Together with $P^+$ sinker 9 and a P type region 25 extending inside epitaxial tub 11, $P^+$ type region 7 forms a collector region. More specifically, region 25 extends vertically from surface 2 of wafer 1 to buried collector region 7, and houses an $N^+$ type base region 26 facing surface 2 of wafer 1; a low-resistivity $N^+$ type region 27 and a detached $P^+$ type emitter region 28 are formed inside base region 26 facing surface 2; and PNP transistor 13 is completed by collector, base and emitter metal contact regions 30, 31, 32 formed through protective oxide layer 18 in direct electric contact with respective regions 9, 27, 28.

The structure is completed by a low-resistivity $N^+$ type region 33 formed in the epitaxial region outside sinkers 8, 9, facing surface 2, in direct contact with an isolation metal region 34 for biasing substrate 4.

Using the fabrication method described in the above patent, the FIG. 1 structure is formed by first simultaneously forming isolation sinker 8 of NPN transistor 12 and collector sinker 9 of PNP transistor 13; P type doping agents are then implanted and diffused with low concentration in epitaxial tub 11 to form region 25 and ensure electric continuity between base region 26 and sinker collector region 9; base region 26 and regions 27, 28 are then formed.

The above known method therefore requires specific steps for forming collector region 25 and base region 26, and, though reduced compared with former structures, still involves considerable fabrication cost in need of reduction.

SUMMARY OF THE INVENTION

It is an object of the present invention to provide a vertical PNP transistor and relative fabrication method enabling a reduction in the number of fabrication steps compared to known transistors.

According to the present invention, there are provided a vertical PNP transistor as claimed in claim 1, and a method of fabricating a vertical PNP transistor, as claimed in claim 11.

BRIEF DESCRIPTION OF THE DRAWINGS

A number of preferred, non-limiting embodiments of the present invention will be described by way of example with reference to the accompanying drawings, in which.

a FIG. 4 shows the same cross section as in FIGS. 2 and 3, relative to a third embodiment of the transistor according to the present invention.

DETAILED DESCRIPTION

Figure 2:
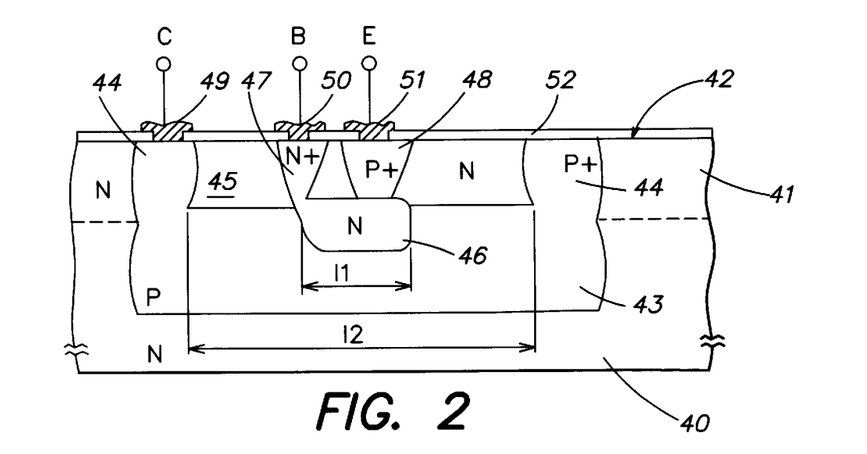
FIG. 2 shows a cross section of a semiconductor material wafer in which is formed a PNP transistor according to a first embodiment of the present invention.

As shown in FIG. 2 illustrating a first embodiment of the present invention, the PNP transistor is integrated in an N type substrate 40 on which is superimposed an N type epitaxial layer 41 having a surface 42; a P type buried collector region 43 extends astride substrate 40 and epitaxial layer 41, and a $P^+$ type collector sinker 44 extends from the outer edges of region 43 to surface 42; collector sinker 44, when viewed from above, laterally surrounds an epitaxial tub 45 to insulate it from the rest of epitaxial layer 41, and also permits surface contact of buried collector region 43; an N type buried base region 46 of extension 11 is formed inside buried collector region 43 and projects slightly inside epitaxial tub 45; an $N^+$ type base sinker 47 extends from an edge portion of buried base region 46 to surface 42 to minimize the contact resistance of the base region and connect buried base region 46 to the surface; a P+ type emitter region 48 extends from surface 42 to base sinker 47 from which it is laterally spaced; and the structure is completed by collector, base and emitter metal contact regions 49, 50, 51 formed through a protective oxide layer 52 covering surface 42, and formed at and in direct electric contact with respective regions 44, 47, 48.

Buried base region 46 constitutes a gain modulating region. More specifically, by appropriately selecting the area of region 46 (length 11 in FIG. 2) in relation to the area of epitaxial tub 45 (length 12 in FIG. 2) and/or the dope concentration, it is possible to modulate the gain of the PNP transistor and so design transistors with different gain characteristics.

Buried base region 46 also provides for preventing buried collector region 43 from reaching the emitter region 48 (vertical punch-through of the transistor), and contributes towards reducing base resistance.

Besides assisting a reduction in base resistance, base sinker 47 also provides for improving the dynamic performance of the transistor.

Figure 3:
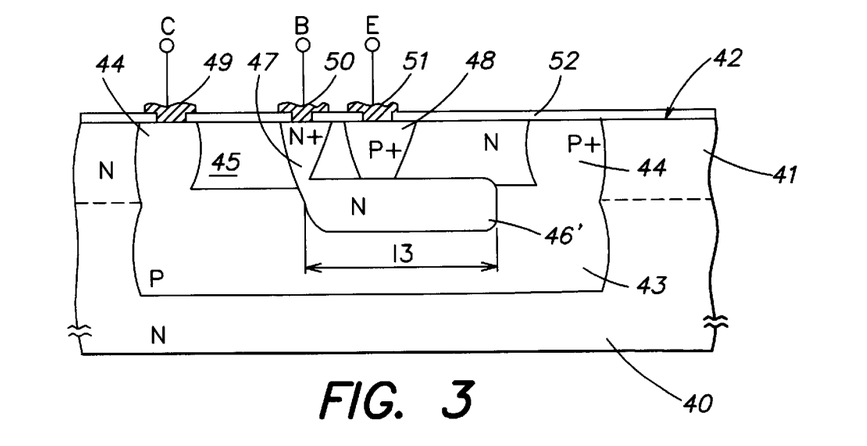
FIG. 3 shows the same cross section as in FIG. 2, relative to a second embodiment of the transistor according to the present invention.

FIG. 3 shows a variation of the FIG. 2 transistor, in which the length 13 of buried base region 46' is greater than 11, so that the FIG. 3 structure presents a lower gain than the FIG. 2 structure, which is also achieved by increasing the doping concentration of buried base region 46.

Figure 4:
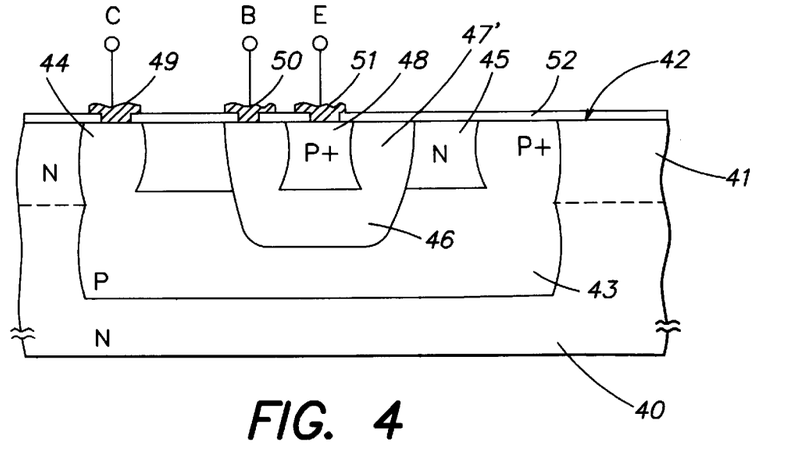

According to a further variation of the invention, the base sinker extends annularly and contiguously about the whole of emitter region 48, as shown in the FIG. 4 section in which the base sinker is indicated 47'. Alternatively, the base sinker may be formed annularly, but spaced apart from emitter region 48. According to a further solution, the base sinker extends contiguously but discontinuously about emitter region 48, as shown in the top plan view in FIG. 5a which shows four sinkers 47"; the gain of the PNP transistor may be modulated by appropriately selecting the number and area of sinkers 47". In the FIGS. 5 and 5a embodiment, sinkers 47" are all connected electrically by a heavily doped N type annular surface region 55, at which one or more base metal contact regions 50 may be provided.

Figure 5:
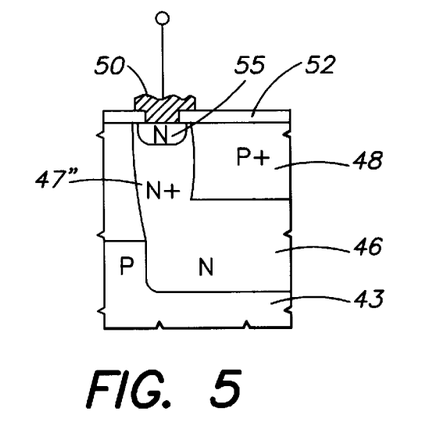
FIG. 5 shows a cross section of a detail of a fourth embodiment of the transistor according to the present invention.
Figure 5A:
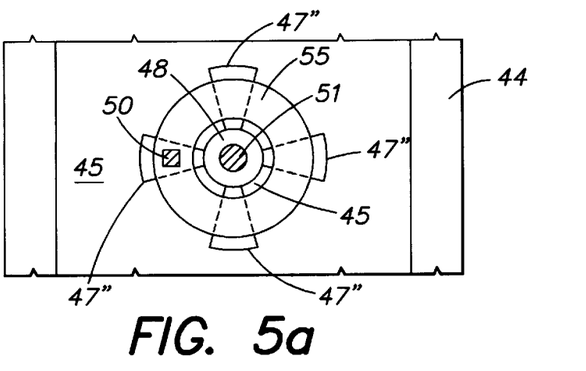
FIG. 5a shows a top plan view of the fourth embodiment in FIG. 5.
Figure 6:
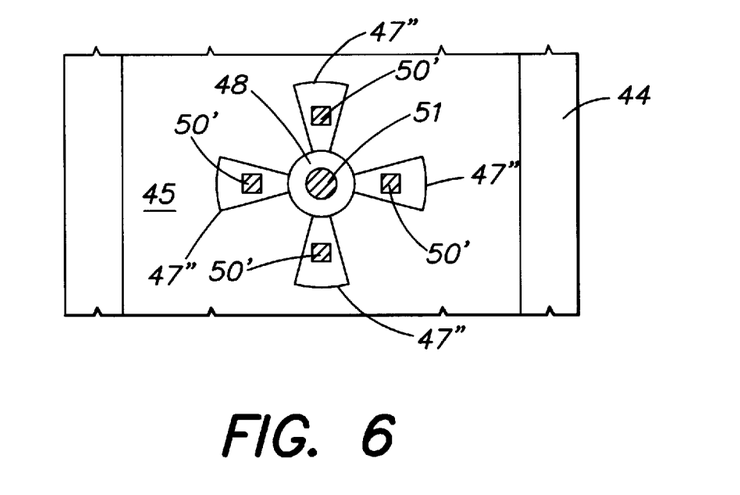
FIG. 6 shows a top plan view of a fifth embodiment of the transistor according to the present invention.

In a further embodiment shown in FIG. 6, a number of base sinkers 47" are provided as in FIGS. 5 and 5a, and connected electrically by a number of metal contact regions 50'—one for each base sinker 47"—connected to one another by a metal base connection (not shown).

Figure 7:
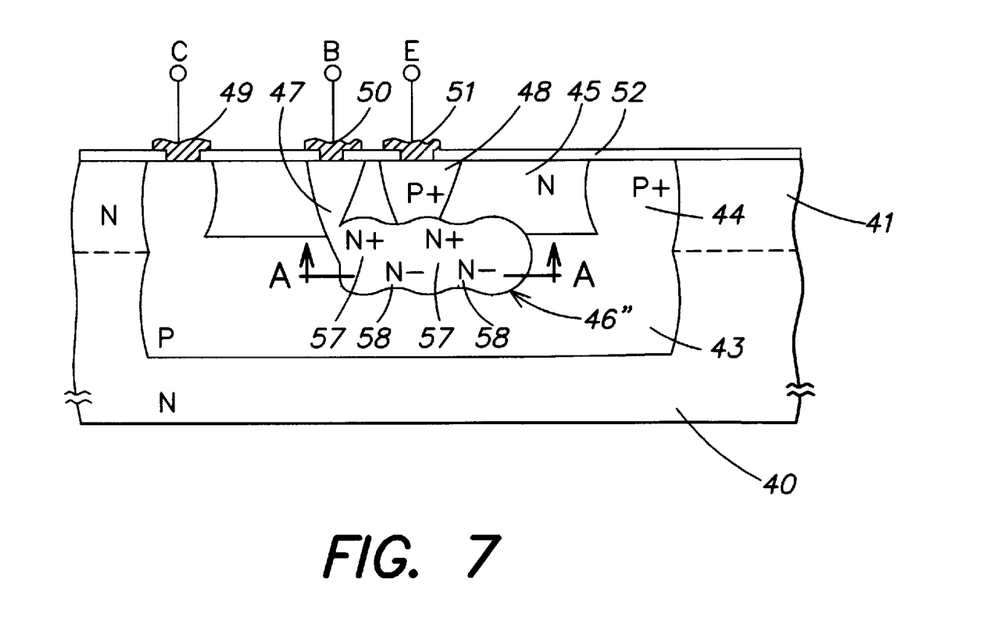
FIG. 7 shows the same cross section as in FIGS. 2–4, relative to a sixth embodiment of the transistor according to the present invention.
Figure 12:
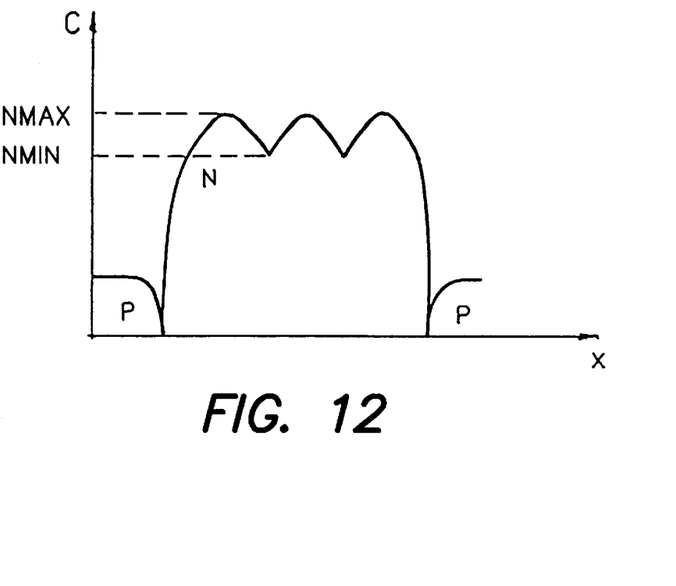
FIGS. 12, 12A and 12B and 13, 13A and 13B show doping profiles and associated masks relative to the FIG. 7 embodiment.
Figure 13:
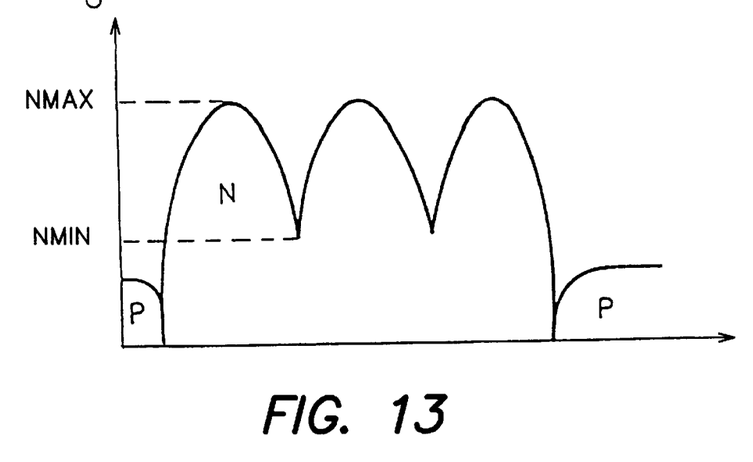

According to a further embodiment, gain may also be modulated by forming a buried base region of variable resistivity using the VLD (Variation Lateral Doping) or variable transparency technique, as shown schematically in FIG. 7, in which the buried base region 46" comprises heavily doped portions 57 (N+) alternating with lightly doped portions 58 (N_) along its length. FIGS. 12 and 13 show two graphs of the doping concentration along section A—A in FIG. 7, and the variation in concentration C (measured as a logarithm of the absolute difference between acceptor and donor doping agents) along buried base region 46". As explained in more detail later on, by varying the geometry of the implant mask of buried base region 46", it is possible to achieve a difference of one order of magnitude between the concentration of the peaks and valleys of the two graphs, i.e. between portions 57 and 58, and hence a considerable variation in gain.

The method of fabricating the FIG. 2 PNP transistor will now be described with reference to FIGS. 8 to 11.

Figure 8:
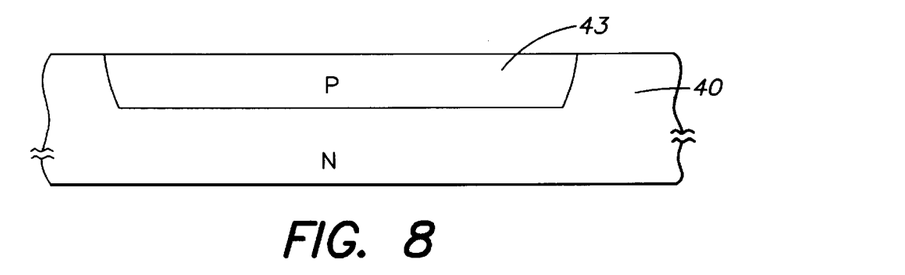
FIGS. 8–11 show cross sections of different steps in the fabrication of the first embodiment in FIG. 2.

Commencing from N type substrate 40, the first step comprises masking, implanting and diffusing P type doping agents to form buried collector region 43, as shown in FIG. 8.

Figure 9:
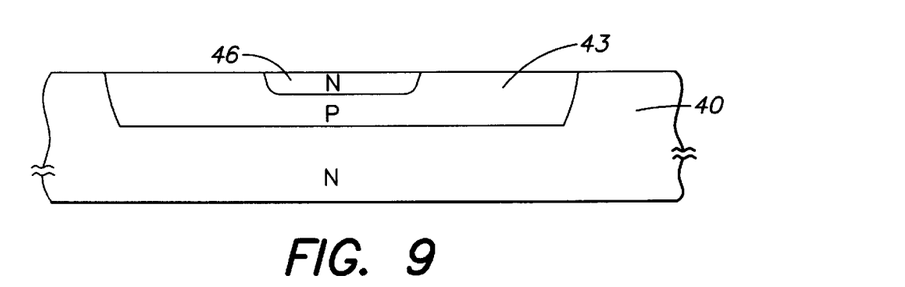
Figure 10:
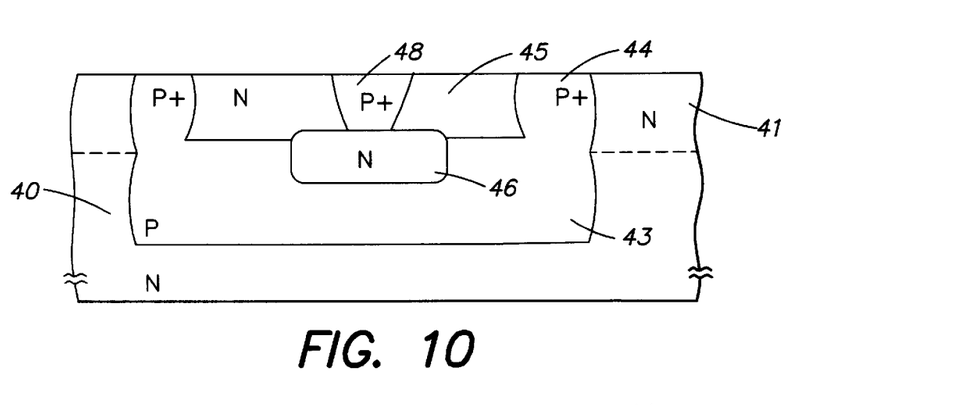

The next step comprises masking, implanting and diffusing N type doping agents into buried collector region 43 to form buried base region 46, as shown in FIG. 9. As explained above, at this step, the size and doping concentration of the buried base region and/or the provision of a variable doping concentration provide for modulating the gain of the finished PNP transistor.

Over the entire surface of the wafer (having the intermediate structure shown in FIG. 9) N type epitaxial layer 41 in which the base and emitter regions are subsequently formed is then grown; P type dopant is implanted and diffused in the wafer to simultaneously form sinker 44 contacting buried collector region 43, and emitter region 48; and epitaxial tub 45 is defined to give the intermediate structure shown in FIG. 10.

Figure 11:
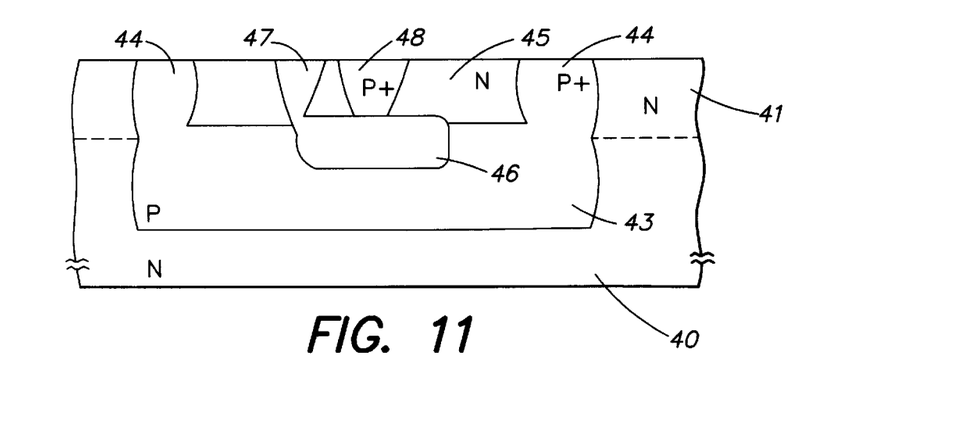

N type doping agents are then implanted (or deposited) at the edge of buried base region 46, and subsequently diffused to form base sinker 47, as shown in FIG. 11.

The fabrication method also comprises the final steps of defining the contact regions (forming openings in protective oxide layer 52) and forming the metal contact and connecting regions to give the structure shown in FIG. 2.

The FIG. 3 structure (with a buried base region 46 of a different size) is formed by appropriately modifying the implant mask of region 46. Similarly, the FIG. 4 structure, featuring an annular base sinker 47 contiguously surrounding emitter region 48, is formed by appropriately modifying the implant mask of region 47.

To obtain the FIGS. 5 and 5a structure, the implant mask of the base sinker must be so designed as to form discontinuous portions 47", and a final step for implanting and diffusing N type dope in the wafer must be provided to form annular region 55 prior to final oxidation of the surface and formation of the metal contact and connecting regions.

The FIG. 6 structure only requires appropriate shaping of the implant mask of the base sinker (portions 47") and the mask for opening the contacts in oxide layer 52.

As already stated, the FIG. 7 structure is formed using the known variable transparency technique, whereby a region is implanted using a mask with openings of given size and a given spacing to achieve the desired variation in the doping level and, hence, a nonconstant doping concentration in one implant step. Gain may therefore be modulated using implant masks with varying openings, but such as to ensure electric continuity throughout the region.

Figure 12A:
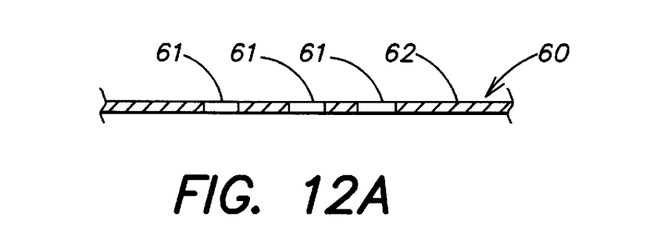
Figure 12B:
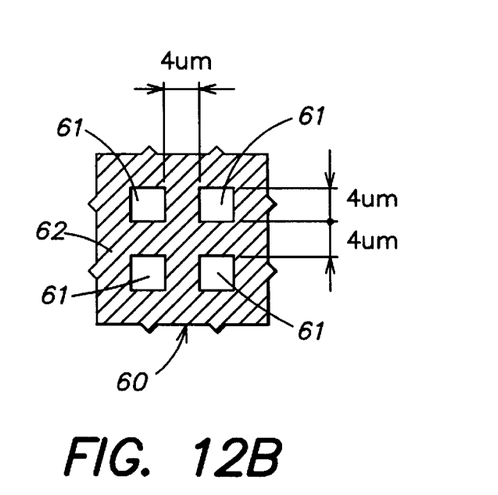

For example, the doping profile in FIG. 12 is obtained using a mask 60 with 4 $\mu$m square openings (light regions) 61 separated by dark regions 62, and wherein the light regions 61 are arranged in a regular grid formation and separated by a distance of 4 $\mu$m, i.e. by a distance equal to the length of each side. Refer to FIGS. 12A and 12B.

Figure 13A:
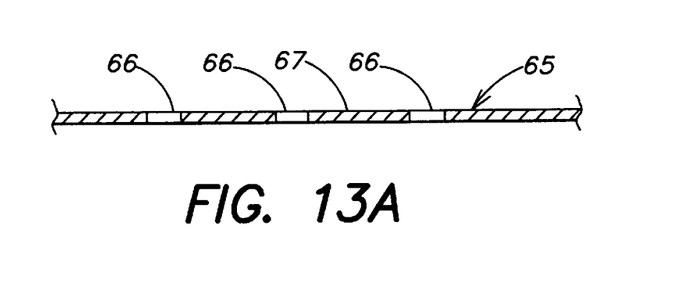
Figure 13B:
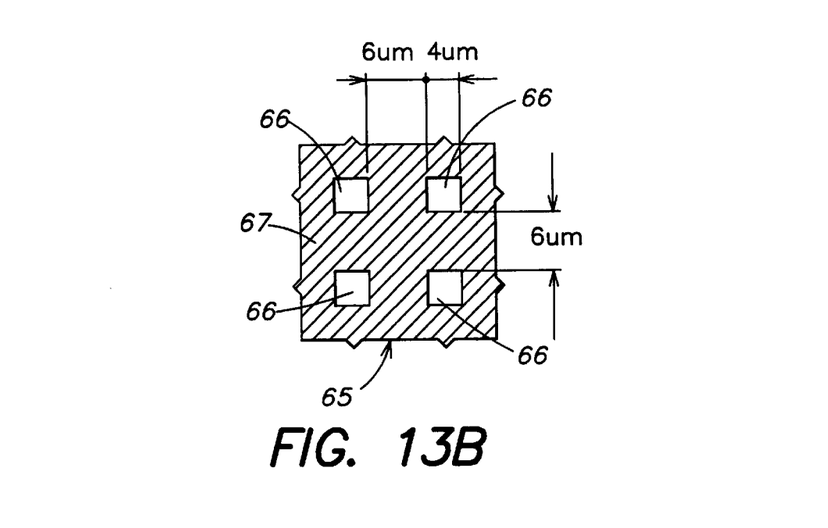

The FIG. 13 profile, on the other hand, is obtained using a mask 65 with 4 $\mu$m square openings (light regions) 66 spaced 6 $\mu$m apart by dark regions 67 and arranged in a regular grid formation. Refer to FIGS. 13A and 13B.

In test and simulation specimens made by the Applicants of the FIG. 2 and 3 embodiments, substrate 40 and epitaxial layer 41 presented a resistivity of roughly 65 $\Omega$*cm; buried collector region 43 presented a layer resistance $R_S$ of 2500 $\Omega/\square$ in the portion beneath buried base region 46, and 670 $\Omega/\square$ in the lateral portion; buried base region 46 presented a layer resistance $R_S$ of 18 Ω/□; base sinker 47 presented a layer resistance $R_S$ of 1 Ω/□; and emitter region 48 presented a layer resistance $R_S$ of 40 Ω/□.

At the end of the fabrication process, the annular surface region 55 of other specimens of the FIGS. 5 and 5a embodiments presented a layer resistance $R_S$ of 20 Ω/□.

Simulation tests performed by the Applicants have shown a considerable variation in gain of the PNP transistors according to the invention alongside variations in the following parameters: extension and doping level of the buried base region; presence or absence of a base sinker; formation of a single base sinker contacting one point along the lateral edge of the buried base region, or formation of an annular region; distance between the base sinker and the emitter region; deep emitter region (extending as far as the buried base region) or shallow emitter region (some distance from the buried base region); forming the buried base region using a continuous transparency technique (complete exposure of the implant area) or variable transparency technique (exposure of only portions of the implant area).

In particular, in the case of a transistor with no base sinker and with a collector current of 100 μA and a voltage (collector-emitter voltage $V_{CE}$) of 2.5 V, a continuous buried base region 46 with an area of 46×52 mm² gives a gain hfe of 139; and a variable transparency buried base region 46" formed using nine 6 μm square light regions 4 μm apart gives a gain hfe of 340.

In the case of a transistor with the FIG. 2 structure and the above collector current and voltage $V_{CE}$, a continuous buried base region 46 with an area of 46×52 μm² gives a gain hfe of 74; and a variable transparency buried base region 46" formed as described above gives a gain hfe of 138.

In the case of an annular sinker 47' contiguously and completely surrounding emitter region 48, with a shallow emitter region (terminating some distance from buried base region 46), a continuous buried base region 46 with an area of 46×52 μm² gives a gain hfe of 2; and a variable transparency buried base region 46" formed as described above gives a gain hfe of 6.

Finally, in the case of a transistor formed as shown in FIG. 7, the FIG. 12 mask 60 gives a gain of 800, and the FIG. 13 mask 65 a gain of 600.

The advantages of the PNP transistor and relative fabrication method according to the invention are as follows.

Fabrication of the PNP transistor is simplified as compared with the known transistor in FIG. 1, by eliminating the steps for forming base region 25. Buried base region 46, 46' or 46", in fact, does not represent an additional region as compared with the known transistor in FIG. 1, by virtue of being formed simultaneously with and using the same implant mask used for forming the low-resistivity buried collector region 15 of the NPN transistor in FIG. 1.

The PNP transistor according to the invention provides for modulating gain, by appropriately selecting the design parameters described above. By appropriately selecting and combining design parameters, it is possible to form, on the same wafer, transistors of different gain and with specific characteristics for adapting device performance to specific requirements.

Figure 14:
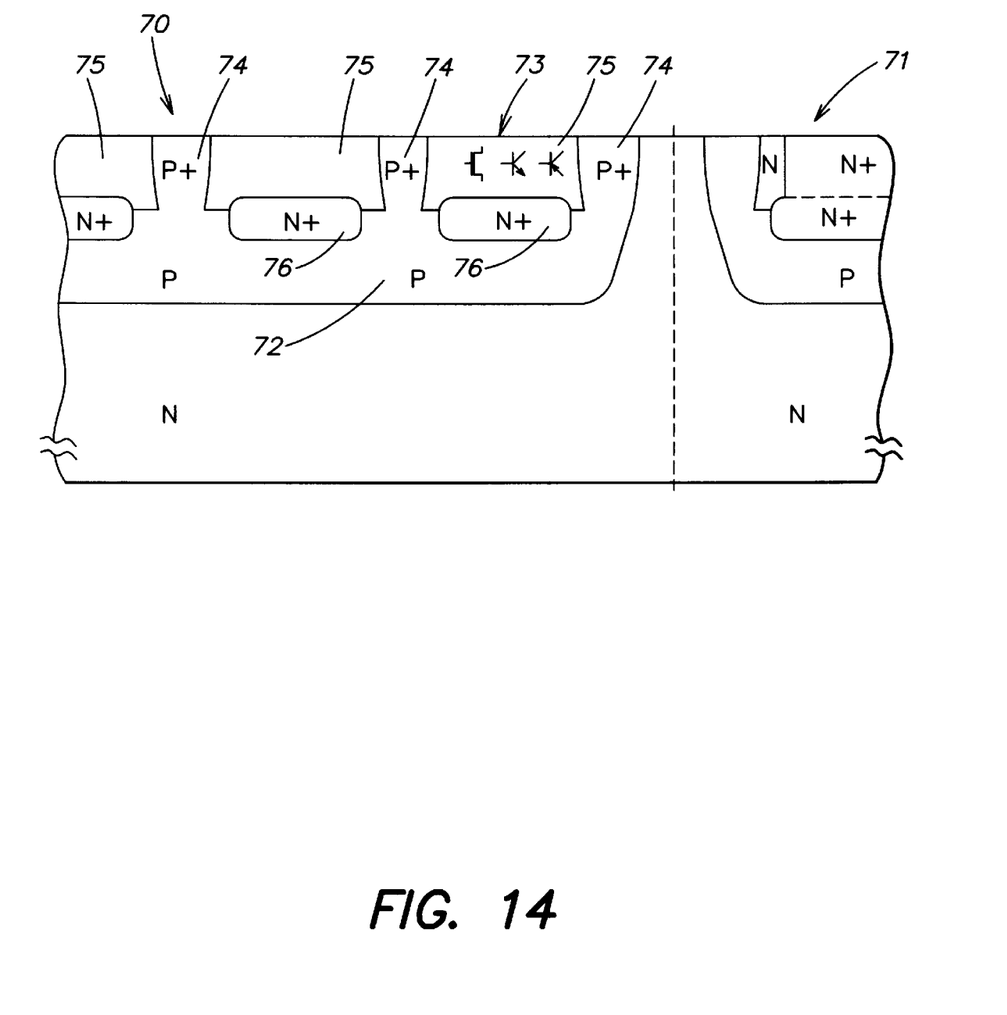
FIG. 14 shows a cross section of a semiconductor material wafer relative to one application of the PNP transistor according to the present invention.

The PNP transistor according to the invention may also be used in the drive circuits of monolithic semiconductor devices further comprising a power stage. Such devices, in which lowvoltage components (drive circuits) and high-voltage components (power stage) are integrated on the same chip, generally feature an isolation structure of the type shown in FIG. 14, which is formed using a known integrating technique involving the growth of an intermediate epitaxial layer growth in which to define the isolation tubs of the various circuit components. As shown in FIG. 14, in which the low and high voltage portions are indicated at 70 and, respectively, 71, the low-voltage portion presents a P type buried region 72 from which P type sinkers 74 defining N type epitaxial tubs 75 extend toward the surface 73 of the device. N type buried regions 76 are provided astride respective epitaxial tubs 75 and buried region 72 to prevent buried region 72 from extending as far as surface 73, and for forming a low-resistivity path for the components requiring one.

The FIG. 14 structure adapts well to integrating the PNP transistor according to the invention. In fact, a comparison with FIGS. 2–7 shows clearly that the buried collector region 43 of the transistor according to the invention may be implemented by buried region 72 in FIG. 14; and the buried base region 46, 46', 46" may be implemented by buried regions 76.

Moreover, since emitter region 48, collector sinker 44 and the other structures forming the transistor according to the invention do not require additional fabrication steps, the PNP transistor according to the invention involves no additional cost as compared with known semiconductor devices comprising a power stage.

Clearly, changes may be made to the transistor and fabrication method as described and illustrated herein without, however, departing from the scope of the present invention.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A vertical PNP transistor integrated in a semiconductor material wafer with a surface comprising:

a P-type buried collector region, an N-type base region contacting said collector region, and a P-type emitter region, said base region comprising an N-type buried base region contiguous with said buried collector region and said emitter region, said buried base region having an area and a doping concentration, said PNP transistor having a pre-selected gain determined by pre-selecting the area of the buried base region, the doping concentration of the buried base region, or a combination thereof;

wherein said base region comprises an N-type epitaxial portion and said buried base region is contiguous with said buried collector region and said epitaxial portion; and wherein said emitter region is a single region extending from the wafer surface to the N-type buried base region.

2. A PNP transistor as claimed in claim 2, comprising an N-type base sinker extending through the entire depth of the epitaxial portion from said surface to said buried base region.

3. A PNP transistor as claimed in claim 2, wherein said base sinker extends through said epitaxial portion and is spaced apart from said emitter region.

4. A PNP transistor as claimed in claim 2, wherein said base sinker extends through said epitaxial portion and is contiguous with said emitter region.

5. A PNP transistor as claimed in claim 2, wherein said base sinker comprises a closed annular shape and surrounds said emitter region.

6. A PNP transistor as claimed in claim 2, wherein said base sinker comprises a number of base portions spaced apart from and surrounding said emitter region.

7. A PNP transistor as claimed in claim 6, further comprising an N-type annular contact region in direct electric contact with said base portions and facing said surface.

8. A PNP transistor as claimed in claim 6, further comprising a number of metal contact regions, each in direct electric contact with a respective base portion.

9. A vertical PNP transistor integrated in a semiconductor material wafer with a surface comprising:
- a P-type buried collector region,
- an N-type base region contacting said collector region, and
- a P-type emitter region,
- said base region comprising an N-type buried base region contiguous with said buried collector region and said emitter region, said buried base region having an area and a doping concentration,
- said PNP transistor having a pre-selected gain determined by pre-selecting the area of the buried base region, the doping concentration of the buried base region, or a combination thereof;
- wherein said base region comprises an N-type epitaxial portion and said buried base region is contiguous with said buried collector region and said epitaxial portion;
- wherein said buried base region comprises a continuously varying N-type doping concentration profile; and
- wherein said doping concentration profile is continuously varying in a horizontal direction.

10. A vertical PNP transistor integrated in a semiconductor material wafer with a surface comprising:
- an N-type substrate;
- a P-type collector region formed in the substrate;
- an N-type epitaxial layer;
- a buried N-type base region formed in the epitaxial layer and contiguous with said collector region;
- a N-type base sinker region and a P-type emitter region formed in the epitaxial layer, extending from the surface to the buried base region, and contiguous with the buried base region;
- wherein said base sinker extends through said epitaxial layer and is spaced apart from said emitter region;
- wherein said base region comprises a continuously varying N-type doping concentration profile;
- wherein said doping concentration profile is continuously varying in a horizontal direction.

11. A PNP transistor as claimed in claim 10, wherein said base sinker extends through said epitaxial layer and is contiguous with said emitter region.

12. A PNP transistor as claimed in claim 10, wherein said base sinker comprises a closed annular shape and surrounds said emitter region.

13. A PNP transistor as claimed in claim 10, wherein said base sinker comprises a number of base portions spaced apart from and surrounding said emitter region.

14. A PNP transistor as claimed in claim 13, further comprising an N-type annular contact region in direct electric contact with said base portions and facing said surface.

* * * * *